United States Patent
Haselby et al.

(10) Patent No.: US 6,802,108 B2
(45) Date of Patent: Oct. 12, 2004

(54) REMOVABLE LIFT HANDLE PANELS

(75) Inventors: Jeffrey Todd Haselby, Dallas, TX (US); Eric Peterson, McKinney, TX (US); Edward D. Geist, Dallas, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/339,272

(22) Filed: Jan. 9, 2003

(65) Prior Publication Data

US 2004/0135479 A1 Jul. 15, 2004

(51) Int. Cl.$^7$ ................................................. A47H 1/08
(52) U.S. Cl. ....................... 16/422; 312/223.1; 312/244
(58) Field of Search .............................. 312/205, 223.1, 312/244, 265.1, 265.6, 348.4, 348.6; 16/412, 413, 422

(56) References Cited

U.S. PATENT DOCUMENTS

| | | | | |
|---|---|---|---|---|
| 2,270,796 A | * | 1/1942 | Hauser | 211/119.004 |
| 4,045,842 A | * | 9/1977 | Theriault | 16/422 |
| 4,378,071 A | * | 3/1983 | Yakimicki | 211/105.4 |
| 5,127,131 A | * | 7/1992 | Corrigan et al. | 16/422 |
| 6,374,460 B1 | * | 4/2002 | Edevold et al. | 312/223.1 |
| 6,655,534 B2 | * | 12/2003 | Williams et al. | 312/223.1 |

* cited by examiner

*Primary Examiner*—Peter R. Brown

(57) ABSTRACT

A detachable carry handle assembly contains a first segment and a second segment that are telescopically interfitted with one another. Sliding of the respective segments relative to one another selectively increases or decreases the overall length of the carry handle assembly, which may be manually manipulated into a plurality of overall length configurations. A spring biased barrel lock assembly may be used to fix the carry handle assembly into a predetermined overall length. The carry handle assemblies may contain rotating handles that to rotate out to a position of maximum width that facilitates lifting operations. Collapse of the handles to a position of minimum width facilitates stowage of the carry handle assemblies in a minimum space.

15 Claims, 3 Drawing Sheets

REMOVABLE LIFT HANDLE PANELS

BACKGROUND OF THE INVENTION

1. Field of the Invention

The invention pertains to the field of lifting devices, such as handles and the like, that are used to carry equipment from one point to another. More specifically, the handles may be selectively attached to electrical equipment and detached once the electrical equipment is installed, for example, in a sliding rack assembly where the attached handles protrude to interfere with sliding motion of the rack assembly.

2. Discussion of the Related Art

In commercial and research facilities, electronic equipment or instrumentation is commonly housed in boxes or chassis that are mounted in electrical equipment racks having standard dimensions. Each rack, according to United States industry standards established by the Electronic Industries Association (EIA), typically has dimensions of approximately seventy-two inches in height, twenty-seven inches in depth, and nineteen inches in width, which corresponds to a rack volume of about 21.4 cubic feet. Standards in other countries may differ. Roller slides are used to hold instruments in a stacked arrangement on the racks and to facilitate movement of each unit out of alignment for replacement, servicing and/or modification. Rack-mounting of equipment in this manner advantageously provides a compact, easy to maintain implementation in a common duty area. Due to dimensional standardization of dimensions, it is difficult to sell non-standard sized commercial or research equipment where the equipment fails to comply with standard dimensions because the equipment cannot be used in the EIA racks.

Electronic equipment manufacturers provide increasing levels of functionality from internal components that have smaller sizes. From time to time, system designers may find it desirable to offer a chassis having a maximum width dimension to incorporate more internal components; however, the equipment can also be quite heavy and may require handles for lifting purposes. Because the rear of the chassis may be inaccessible for lifting purposes and because ergonomics may preclude the attachment of handles to the front of the chassis, handles are sometimes most conveniently located on the sides of the chassis across the width dimension. These handles may protrude to a greater width dimension than does the overall chassis. A problem arises when the handles interfere with sliding motion of the roller-slide assembly by abutting vertical support members of the equipment rack.

U.S. Pat. No. 5,505,533 discloses a rackmount chassis that adapts a standard personal computer for rack usage by encapsulating the personal computer. A handle is built into the side of the chassis for lifting of the assembly. The handle is formed of a dual-pivoting assembly in which the grasping portion of the handle that pivots on its axis of elongation. At least four pivoting operations are required to deploy the handle for lifting operations. Due to the positioning of his handle, the lifting operations are ergonomically incorrect, as the lifter's strength and grip are significantly compromised due to the twisting and bending motion of the wrist. This weakening occurs because the lifter's hand must engage the side-mounted handle in a handshake configuration as the lifter pushes the chassis forward.

Handles for lifting of electronic equipment cease to be a mere convenience and become a necessity when heavier items are being installed. For example, network server packages can weigh from one hundred to five hundred pounds (45 to 230 kilograms). Team lifting of these heavier items is a necessity. In some instances, the chassis that is being lifted contains sunken handholds that facilitate lifting. These handholds impose a burden that the wrists of the lifters are not optimally aligned with the chassis. The handholds also create a significant risk of personal injury to the lifters and/or damage to the equipment. In other instances, handles are temporarily attached to the chassis. The handles are removed after the equipment is installed, and storage is inconvenient because the loose handles are generally regarded as clutter until they are needed. It is a significant inconvenience that the handles often cannot be found when it is time to remove the chassis from the rack or to reposition the chassis in the rack. Detachable handles are usually not interchangeable between different chassis styles, such as chassis having different length dimensions, so it is also difficult to find substitute handles. When the handles cannot be found, there is significant risk of injury to the lifters or equipment damage in the attempt to move the chassis with improper lifting equipment.

There remains a need to provide a carry handle assembly that can be selectively attached and detached for use in lifting operations, yet are adjustable for convenient storage.

SUMMARY

The adjustable carry handle assembly shown and described herein overcomes the problems outlined above by permitting selective adjustment to a plurality of overall lengths, for example, lengths that facilitate both lifting operations and convenience in storage. The carry handle assemblies may also be adjusted to a plurality of lengths for use in lifting a chassis of any length.

The carry handle assembly includes a first segment and a second segment that are telescopically interfitted in a manner that permits manual manipulation to achieve a plurality of overall lengths. The first segment contains at least one lengthwise receptacle, e.g., a channel, of sufficient dimensions for receiving at least part of the second segment. The second segment is at least partially received in the lengthwise receptacle to establish a telescoping interfit through which an overall length of the carry handle assembly can be adjusted by lengthwise shifting of the second segment within the lengthwise receptacle. At least one carry handle is attached to one of the first segment and the second segment. A mounting structure, such as pins, bayonet latches, clip fasteners, screws and bolts, is used for coupling the carry handle assembly with the chassis. The carry handle assembly may be attached for lifting purposes, removed, and adjusted to an overall length that permits storage on an electrical equipment rack.

The carry handle assembly may contain any number of handles. For example, a first handle may be attached to the first segment, and a second handle may be attached to the second segment. In this configuration, lengthwise shifting of the second segment within the lengthwise receptacle alters a length dimension between the first carry handle and the second carry handle. The carry handle assembly may be locked in a fixed length to prevent its removal from the chassis. Accordingly, threaded fasteners are not necessarily required to couple the carry handle assembly to the chassis.

A latch mechanism, such as a threaded fastener or a spring biased barrel lock, may be mounted on the carry handle assembly to lock the first segment and the second segment in a fixed overall length. While the latch mechanism is not necessarily required, it prevents collapse of the telescoping first and second segments and may be used to selectively attach the carry handle assembly to the chassis solely by virtue of this extension, for example, as pins on either end of the carry handle assembly are driven into engagement with the chassis when the carry handle assembly is extended. The latch mechanism may operate, for example, through use of a spring biased barrel lock that thrusts a plunger through a first hole in the first segment and a second hole on the second segment when the first and second holes are aligned to permit passage of the plunger.

The adjustable carry handle assembly may include a carry handle that contains a pivoting handle having a range of pivoting motion over a vertical arc. Pivoting the handle over the arc selectively increases or decreases a width of the carry handle assembly. An abutment may be provided that limits the range of the arc, e.g., from about 0° to 90°. Outward termination of the arc may occur, for example, at a point of maximum width, which is also the most favorable point of termination for lifting purposes The mounting structure may optionally include a mounting structure abutment, such as a dogleg abutment, that requires mounting of the carry handle assembly in a predetermined orientation relative to the chassis. The dogleg abutment may, for example, be attached to one of the first segment and the second segment, and extend to a greater length dimension than the overall length dimension.

The mounting structure may also include a plurality of openings for receipt of pins. These openings may be oriented to receive the pins in a position where axes of elongation in the threaded fasteners are oriented in parallel with the overall length dimension of the carry handle assembly, such that extension of the carry handle assembly drives the pins into engagement with the chassis.

The aforementioned structure permits sliding the first segment and the second segment relative to one another to establish an overall length that is required for mounting the carry handle assembly on the chassis. The carry handle assembly may then be attached to the chassis through use of the mounting structure.

DETAILED DESCRIPTION

Figure 1:
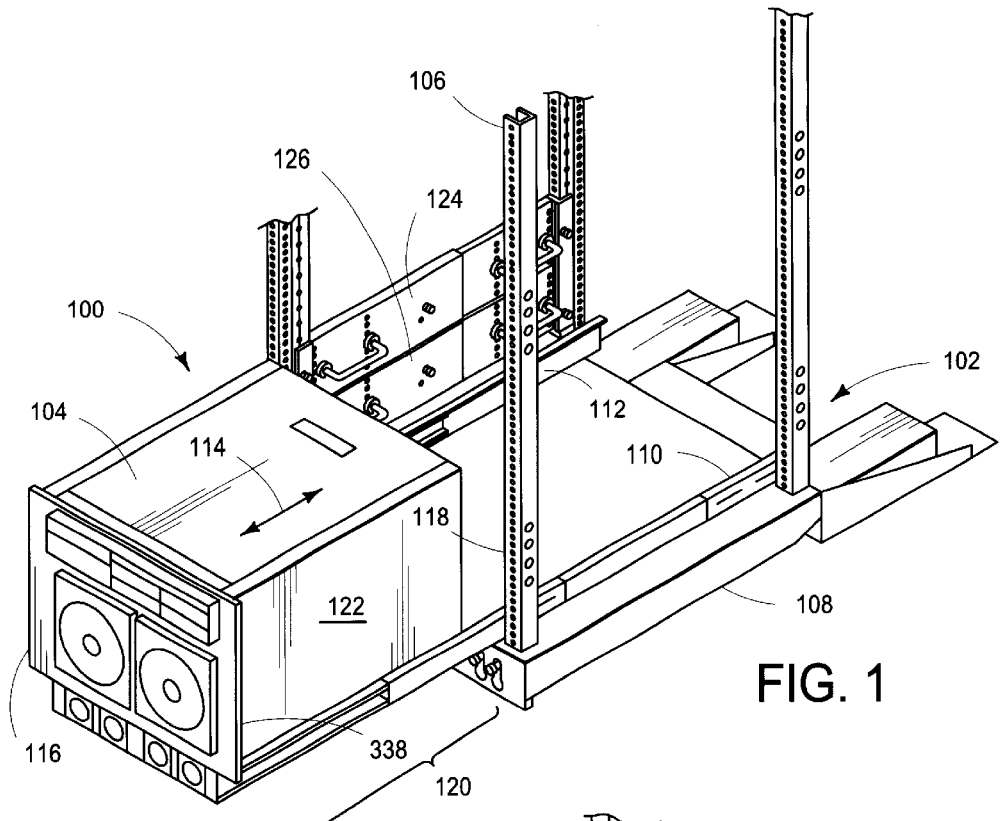
FIG. 1 is a left front isometric view of a chassis installed in an electrical equipment rack with carry handle assemblies stored on the electrical equipment rack for reattachment to the chassis and subsequent use in lifting operations.

FIG. 1 depicts a system 100 including an electrical equipment rack 102 that supports a chassis 104. The electrical equipment rack 102 includes a plurality of upright posts, such as post 106, which are supported by a base 108. Paired roller slide assemblies 110 and 112, form tracks that facilitate forward and rearward shifting motions shown by double headed arrow 114. The roller slide assemblies 110 and 112 are bolted to the posts 106 at height intervals that permit installation of additional chassis above chassis 104. As shown in FIG. 1, chassis 104 is shifted fully forward for maintenance operations and in this position may be removed from the equipment rack 102. Full rearward motion exists when face 116 of chassis 104 is substantially even with front surface 118 of post 106. The equipment rack 102 may have the standard dimensions and features defined by EIA, or the dimensions of any other type of electrical equipment rack.

The chassis 104 internally houses electrical equipment, such as a commercial or laboratory instrument, a telecommunications server or router, a computer, audio equipment, or any other form of electrical equipment. Roller slide assembly 110 bolts to chassis 104 along interval 120 beneath a removable side 122. Chassis 104 does not include carry handles. There is insufficient clearance between the removable side 122 and post 106 such that, if side-protruding carry handles were installed, the handles would prevent full rearward motion of chassis 104 by abutting post 106.

Figure 1A:
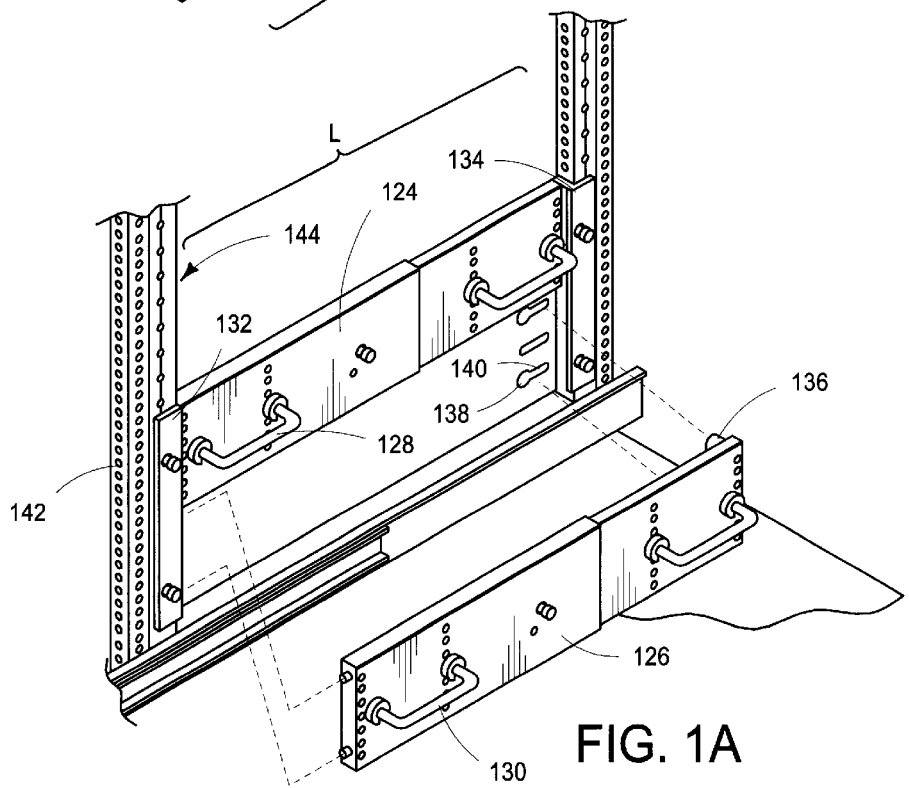
FIG. 1A is a diagram showing additional detail with respect to the stored carry handles of FIG. 1.

FIG. 1A provides additional detail with respect to FIG. 1 and the mounting of carry handle assemblies, such as carry handle assembly 124. Carry handle assembly 124 is shown in a storage position mounted on equipment rack 102 with handles 128 protruding inward. Carry handle assembly 126 is shown in the process of being mounted for storage. Carry handle assemblies 124 and 126 are intended for team-lifting use when mounted on a side of chassis 104 remote from side 122. Any number of carry handle assemblies 124 and 126 may be installed on chassis 104 for team lifting purposes. Carry handle assemblies 124 and 126 are mounted on opposed wing brackets 132 and 134 after being telescopically adjusted to an overall length L. A shoulder screw 136 passes through a keyway 138 and fully engages slot-neck 140 with full lengthwise extension of carry handle assembly 126 to the overall length L. In this storage position, inwardly protruding handles 128 and 130 do not interfere with sliding motion of chassis 104 on roller slide assemblies 110 and 112, for example, due to the increased width dimension afforded by front edge 142 of front post 144.

Figure 2:
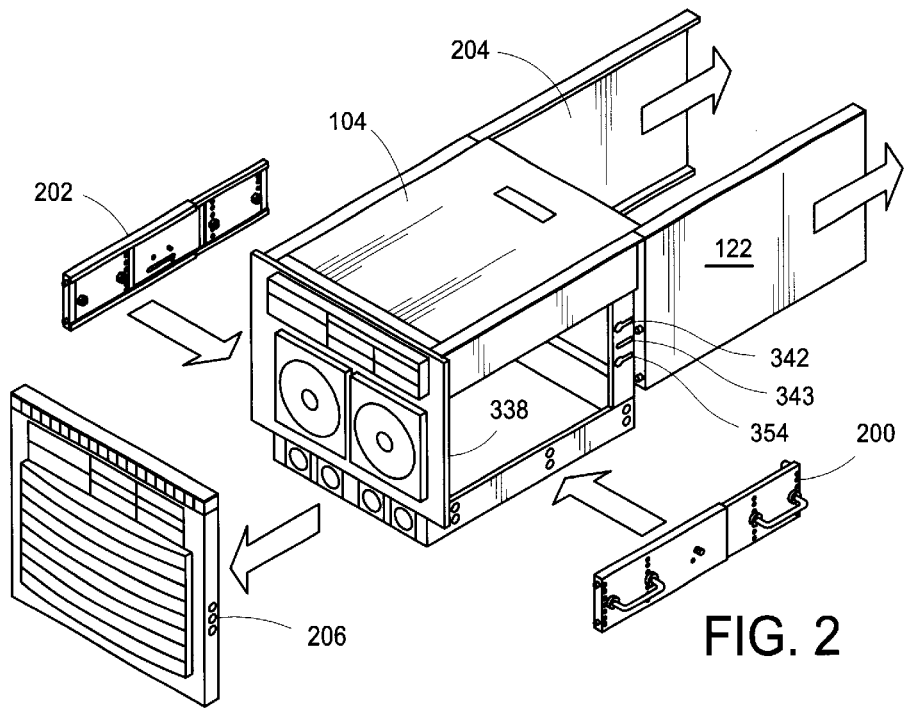
FIG. 2 is an assembly view showing installation of the carry handle assemblies on the chassis.

FIG. 2 is an assembly view that depicts installation of carry handle assemblies 200 and 202 onto chassis 104. The carry handle assemblies 200 and 202 are temporarily installed, as needed, for lifting chassis 104 onto and off of rack 102. Removable sides 122 and 204 slide rearwardly for removal from chassis 104. A clip-mounted front panel 206 may be detached from chassis 104 by pulling the front panel 206 forward. The carry handle assemblies 202 and 204 are mirror images of one another. Removal of the carry handle assemblies from chassis 104 comprises movements opposite those shown in FIG. 2.

Figure 3:
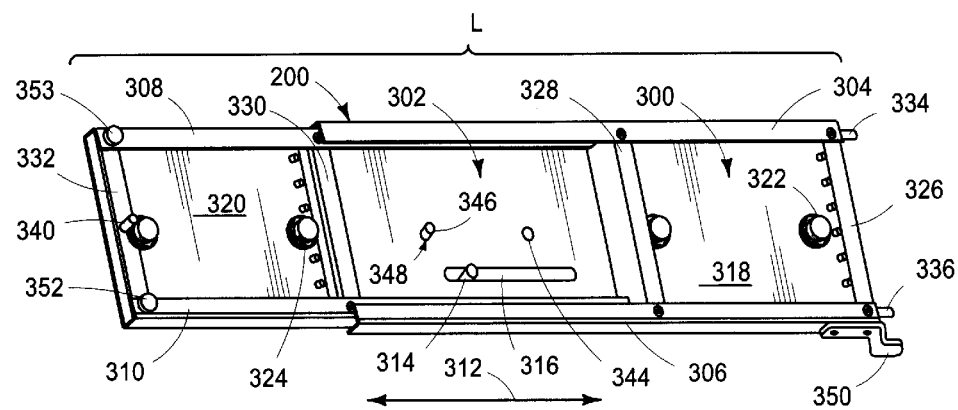
FIG. 3 is a left side isometric view of a right side carry handle assembly also shown in FIG. 2.

FIG. 3 shows carry handle assembly 200 from a left side internal elevational perspective. Carry handle assembly 200 is formed of a generally rectangular first segment 300 and a generally rectangular second segment 302. The first segment 300 is made, for example, of sheet metal that is bent to form a pair of opposed lengthwise channels 304 and 306, each forming a channel receptacle that receives a portion of a corresponding lengthwise shoulder 308 or 310 of the second segment 302. Thus, the second segment 302 is at least partially received in the lengthwise channels 304 and 306 to establish a telescoping interfit through which a variable overall length L of the carry handle assembly 200 can be adjusted by lengthwise shifting motion 312 of the second segment 302 within the lengthwise channels 304 and 306. A pin 314 attached to the first segment 300 protrudes through a lengthwise slot 316 in the second segment 302 to prevent removal of the second segment 302 from the channels 304 and 306. Optional reinforcing panels 318 and 320 are respectively riveted to the corresponding first segment 300 and the second segment 302 to provide increased support for forces imparted by carry handles 322 and 324.

Cross-member stiffeners 326 and 328 are riveted to the channels 304 and 306 to provide structural support between the channels 304 and 306 of first segment 300. Similarly, cross-member stiffeners 330 and 332 provide structural support between the shoulders 308 and 310 of second segment 302. Pin bolts 334 and 336 protrude forward of cross-member stiffener 326 to facilitate bolt-coupling of the first segment 300 with wing 338 of chassis 104 (see FIGS. 1 and 2). A pin 340 protrudes outwardly from stiffener 332 a sufficient distance to slidingly engage raceway 343 in chassis 104 (see FIG. 2).

Apertures 344 and 346 are formed in the second segment 302 for receiving a spring-biased barrel bolt 348 that locks the carry handle assembly 200 into a fixed overall length L corresponding to the selective alignment of the spring-biased barrel bolt 348 with aperture 344 or aperture 346. The capacity to vary the fixed overall length L in this manner, where the barrel bolt 348 is selectively engaged or disengaged, permits selective adjustment of the overall length L. Locking the carry handle assembly 200 into the longest fixed overall length L prevents removal of the carry handle assembly from chassis 104, as described in more detail below. The spring-biased barrel bolt 348 is biased towards insertion through one of the apertures 344 or 346.

A dogleg abutment 350 is riveted to the bottom of channel 306 to prevent installation of carry handle assembly 200 in an improper orientation with respect to chassis 104.

Figure 5:
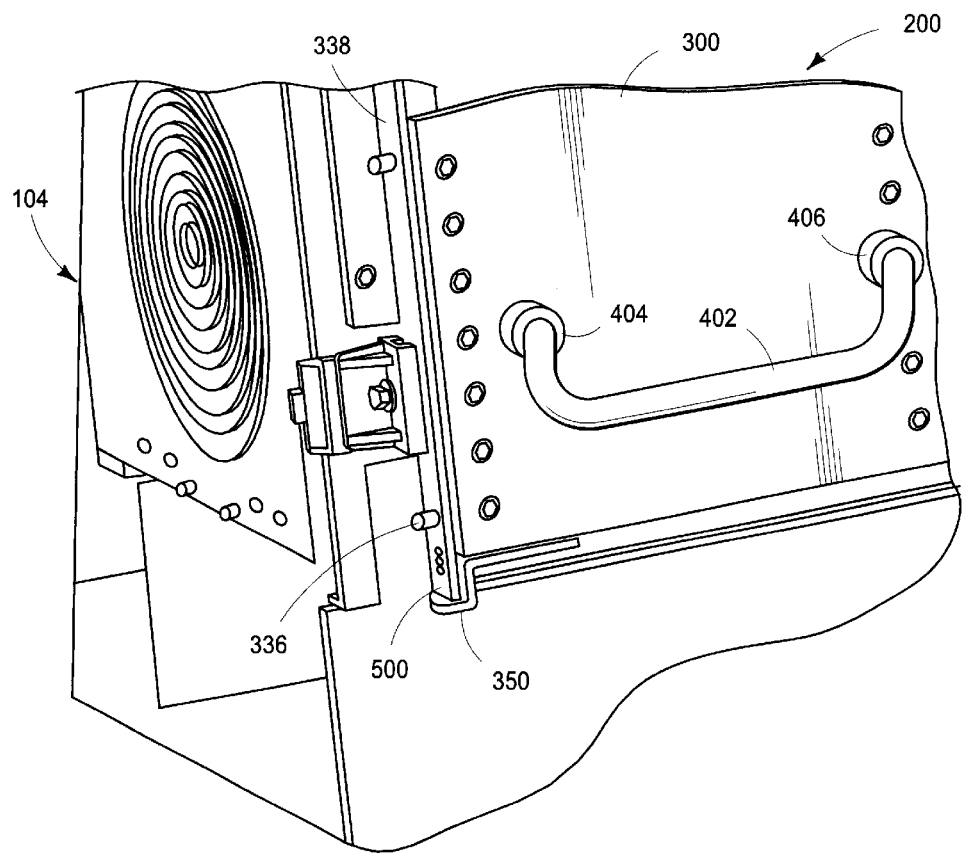
FIG. 5 is an isometric view of a dogleg abutment that prevents misoriented installation of the carry handle assembly.

Shoulder screws 352 and 353 engage keyways 342 and 354 in chassis 104 (See FIG. 2) at an overall length of full extension L to provide increased support for lifting operations. Pin 340 protrudes a greater distance that do the shoulder screws 352 and 353 such that pin 340 engages raceway 343 prior to the insertion of shoulder screws 353 and 353 into keyways 343 and 354. Full lengthwise extension occurs with the shoulder screws 352 and 353 engaging keyways 342 and 354 while pin bolts 334 and 336 engage wing 338, as shown in FIG. 5. The carry handle assembly 200 is locked into a fixed length L by the insertion of barrel bolt 348 into aperture 344. From this position, the carry handle assembly 200 cannot be removed from chassis 104 unless the barrel bolt 348 is withdrawn from aperture 344 for telescoping contracture of segments 300 and 302. A shorter stowage length L is produced by the insertion of barrel bolt 348 within aperture 346, as shown for example in FIG. 3.

Figure 4:
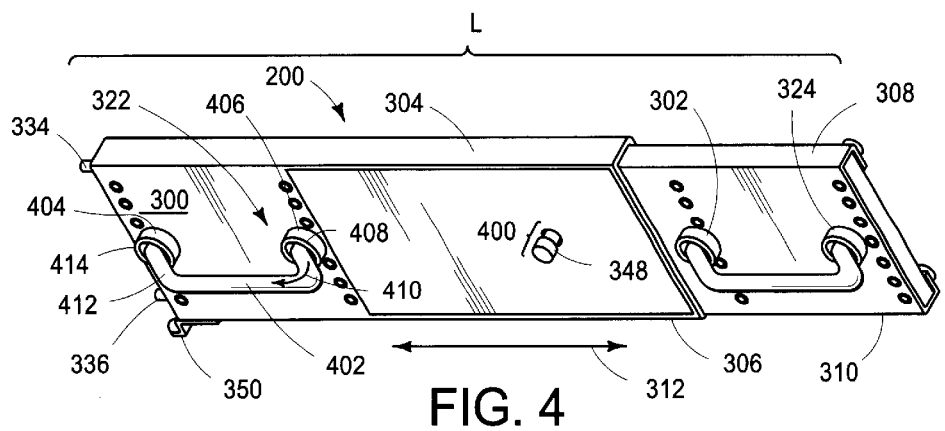
FIG. 4 is a right side isometric view of the carry handle assembly shown in FIG. 3.

FIG. 4 shows the carry handle assembly 200 from a right side rear elevational perspective. This perspective shows external components of the barrel bolt 348 including a protruding segment 400 designed to be manually grasped. The carry handles 322 and 324 are optionally each identically formed of a central handle 402 connecting a pair of downwardly open U-brackets 404 and 406. A pin 408 protrudes through each of the U-brackets 404 and 406 at the respective ends of handle 402 to permit pivoting motion of handle 402 along an arc 410 extending approximately 90° until, for example, a top surface 412 of handle 402 abuts the base 414 of U-bracket 404 to prevent further upward rotation of handle 402 along arc 410.

FIG. 5 demonstrates the operation of dogleg abutment 350 in aligning carry handle assembly 200 with chassis 104 of FIG. 1. The dogleg abutment 350 drops below and passes across the lower extremity 500 of wing 338. This feature prevents installation of carry handle assembly 200 in a backwards or upside down configuration.

In operation, the carry handle assembly 200 is positioned against wing 338. Pin bolts 334 and 336 affix the first segment 300 to wing 338, as shown in FIG. 5, with the dogleg abutment assuring proper orientation of carry handle assembly 200. The second section 302 is manually manipulated to slide lengthwise forming an overall length L with shoulder screw 352 positioned in slot 354. With a plurality of carry handle assemblies, such as 124, 126, 200, and 202, installed, chassis 104 can be team-lifted from and onto the equipment rack 104. When lifting is completed, the carry handle assemblies 124, 126, 200, and 202 can be removed from chassis 104 and stowed on the equipment rack 102, as shown in FIG. 1A.

Figure 6:
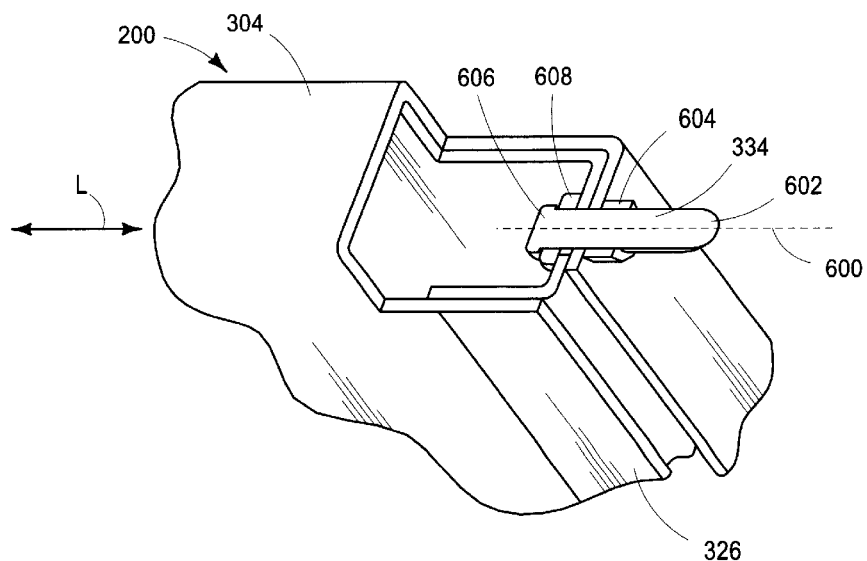
FIG. 6 depicts a mounting structure in the form of a threaded fastener that may be used to couple the carry handle assembly with the chassis.

FIG. 6 is a midsectional view that depicts the installation of pin-bolt 334 in stiffener 326. The pin-bolt 334 is elongated along axis 600 in parallel the overall length L of carry handle assembly 200. A rounded head 602 functions as a pin that may be grasped to rotate the pin-bolt 334. A wrench may be used to turn hexagonal shoulder 604 if manual grasping of the head 602 exerts insufficient force for this rotation. The hexagonal shoulder 604 may also abut wing 338, as shown in FIG. 5, as the pin protrudes through wing 338 for retention of the first segment 300 on chassis 104. A threaded base 606 is received in a press-fit nut 608. Alternatively, pin-bolts 334 and 336 may be replaced by threaded fasteners; however, the installation described where lengthwise shifting of the carry handle assembly 200 locks the carry handle assembly in place on chassis 104 without the use of threaded fasteners is preferred for ease of use.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

We claim:

1. An adjustable carry handle assembly for use in carrying a chassis, comprising:
   a first segment;
   a second segment,
   the first segment including a lengthwise receptacle of sufficient dimensions for receiving at least part of the second segment,
   the second segment being at least partially received in the lengthwise receptacle to establish a telescoping interfit through which an overall length of the carry handle assembly can be adjusted by lengthwise shifting of the second segment within the lengthwise receptacle;
   at least one carry handle attached to one of the first segment and the second segment; and
   mounting structure for coupling the carry handle assembly with the chassis,
   wherein the carry handle comprises a pivotable handle having a range of pivoting motion over a vertical arc such that a width of the carry handle assembly may be altered by pivoting the carry handle through the range of motion.

2. The adjustable carry handle assembly as set forth in claim 1, wherein the carry handle is a first carry handle attached to the first segment and further comprising a second handle attached to the second segment, such that lengthwise shifting of the second segment within the lengthwise receptacle alters a length dimension between the first carry handle and the second carry handle.

3. The adjustable carry handle assembly as set forth in claim 1, further comprising a latch mechanism mounted on the carry handle assembly to lock the first segment and the second segment in a fixed overall length.

4. The adjustable carry handle assembly as set forth in claim 3, wherein the first segment defines a first hole, the second segment defines a second hole that can be aligned with the first hole by lengthwise shifting of the second segment within the lengthwise receptacle, and the latch mechanism comprises a spring biased plunger assembly oriented to insert a plunger under bias into the first hole and the second hole when the first hole is aligned with the second hole.

5. The adjustable carry handle assembly as set forth in claim 1, wherein the lengthwise receptacle comprises a channel.

6. The adjustable carry handle assembly as set forth in claim 5, wherein the channel comprises an abutment structure substantially preventing all motion but lengthwise shifting of the first segment and the second segment relative to one another.

7. The adjustable carry handle assembly as set forth in claim 1, wherein the pivoting handle comprises an abutment that terminates the range of motion at a position of maximum width.

8. The adjustable carry handle assembly as set forth in claim 1, wherein the mounting structure comprises an abutment positioned to require mounting of the carry handle assembly in a predetermined orientation relative to the chassis when the carry handle assembly is mounted on the chassis.

9. The adjustable carry handle assembly as set forth in claim 1, wherein the mounting structure comprises means for retaining the carry handle assembly on the chassis by virtue of lengthwise extension of the carry handle assembly on the chassis.

10. The adjustable carry handle assembly as set forth in claim 1, wherein the mounting structure comprises a plurality of openings in one of the carry handle assembly and the chassis for receipt of alignment pins in the other of the carry handle assembly and the chassis.

11. The adjustable carry handle assembly as set forth in claim 10, wherein the plurality of openings are oriented to receive the pins in a position where axes of elongation in the pins are oriented in parallel with the overall length dimension of the carry handle assembly.

12. A method of installing a carry handle assembly on a chassis where the carry handle assembly includes a first segment telescopingly interfitted with a second segment, and a pivotable handle having a range of pivoting motion over a vertical arc such that a width of the carry handle assembly may be altered by pivoting the carry handle through the range of motion, the method comprising the steps of:

sliding the first segment and the second segment relative to one another to establish an overall length for mounting the carry handle assembly on the chassis;

coupling the first segment and the second segment with the chassis to install the carry handle assembly on the chassis; and pivoting the pivotable handle to alter the width of the carry handle assembly.

13. The method according to claim 12, wherein the step of sliding the first segment relative to the second segment comprises locking the first segment and the second segment into a fixed overall length equal to the overall length that is required for mounting the carry handle assembly on the chassis.

14. The method according to claim 12, wherein the step of coupling the first segment and the second segment with the chassis comprises aligning the carry handle assembly with the chassis through use of an abutment mounted on one of the carry handle assembly and the chassis.

15. The method according to claim 14, wherein the step of sliding the first segment and the second segment comprises altering the overall length relative to a plurality of alignment pins on one of the carry handle assembly and the chassis in a direction such that each alignment pin presents an axis of elongation in parallel with the overall length.

* * * * *